United States Patent
Severin et al.

(10) Patent No.: US 10,877,101 B2
(45) Date of Patent: Dec. 29, 2020

(54) METHOD FOR DETERMINING PARAMETERS OF AN ELECTROCHEMICAL ENERGY STORE IN A COMPUTER-AIDED MANNER

(71) Applicant: SIEMENS AKTIENGESELLSCHAFT, Munich (DE)

(72) Inventors: Anja Severin, Munich (DE); Philipp Wolfrum, Munich (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 303 days.

(21) Appl. No.: 15/775,841

(22) PCT Filed: Aug. 12, 2016

(86) PCT No.: PCT/EP2016/069226
§ 371 (c)(1),
(2) Date: May 14, 2018

(87) PCT Pub. No.: WO2017/084780
PCT Pub. Date: May 26, 2017

(65) Prior Publication Data
US 2018/0328997 A1    Nov. 15, 2018

(30) Foreign Application Priority Data
Nov. 17, 2015 (DE) .......................... 10 2015 222 683

(51) Int. Cl.
*G01R 31/367* (2019.01)
*G01R 31/3842* (2019.01)
*G01R 31/389* (2019.01)

(52) U.S. Cl.
CPC ....... *G01R 31/367* (2019.01); *G01R 31/3842* (2019.01); *G01R 31/389* (2019.01)

(58) Field of Classification Search
CPC .................................................. G01R 31/367
See application file for complete search history.

(56) References Cited

U.S. PATENT DOCUMENTS

| | | |
|---|---|---|
| 2013/0006455 A1 | 1/2013 | Li |
| 2013/0185008 A1 | 7/2013 | Itabashi et al. |

(Continued)

FOREIGN PATENT DOCUMENTS

| | | |
|---|---|---|
| CN | 103941191 A | 7/2014 |
| CN | 104569691 A | 4/2015 |

(Continued)

OTHER PUBLICATIONS

Ala Al-Haj Hussein "An Overview of Generic Battery Models", IEEE, 2011.*

(Continued)

*Primary Examiner* — Manuel A Rivera Vargas
(74) *Attorney, Agent, or Firm* — Schmeiser, Olsen & Watts LLP (57) ABSTRACT

Provided is a method for determining parameters of an electrochemical energy store in a computer-aided manner, wherein a plurality of temporally successive measurement data records having respective assigned measurement times and a predefined model of the energy store are processed. A particular measurement data record includes a measured voltage value of a terminal voltage of the energy store, a measured current value of a current flow in the form of a charging or discharging current of the energy store and a state of charge measured value of the state of charge of the energy store Equation parameters of at least one linear (Continued)

equation system are stipulated in the method, which equation system is based on the predefined model.

15 Claims, 3 Drawing Sheets

(56) References Cited

U.S. PATENT DOCUMENTS

2014/0114595 A1* 4/2014 Wickert ................ H01M 10/48
702/63
2018/0328997 A1 11/2018 Severin et al.

FOREIGN PATENT DOCUMENTS

WO            2017084780 A1    5/2017
WO    WO 2017084780 A1    5/2017

OTHER PUBLICATIONS

Australian Office Action dated Apr. 9, 2019 for Application No. 2016357168.

Ala Al-Haj Hussein et al; "An overview of generic battery models"; Power and Energy Society General Meeting, 2011 IEEE; pp. 1-6; ISBN: 978-1-4577-1000-1; DOI: 10.1109/PES.2011.6039674; XP032055694; 2011.

Christophersen J. P. et al; "Lumped parameter modeling as a predictive tool for a battery status monitor"; Vehicular Technology Conference, 2003. VTC 2003-Fall. 2003 IEEE 58th Orlando, FL, USA; Oct. 6-9, 2003; Piscataway, NJ, USA, IEEE, US; Bd. 5; pp. 3257-3261; ISBN: 978-0-7803-7954-1; DOI: 10.1109/VETECF.2003.1286255; XP010702932;; 2003.

Johnson V. H.; "Battery performance models in Advisor"; Journal of Power Sources, Elsevier SA, CH; Bd. 110; Nr. 2; pp. 321-329; ISSN:0378-7753; DOI:10.1016/S0378-7753(02)00194-5; XP004393630;; 2002.

Wang Yuj I. E. et al; "A method for state-of-charge estimation of Li-ion batteries based on multi-model switching strategy"; Applied Energy; Bd. 137; pp. 427-434; ISSN: 0306-2619; DOI:10.1016/J.APENERGY.2014.10.034; XP029098596;; 2014.

PCT International Search Report of International Searching Authority dated Nov. 21, 2016 corresponding to PCT International Application No. PCT/JP 2016/069226 filed Aug. 12, 2016.

Notice of Acceptance dated Jun. 28, 2019 for Australian Application No. 2016357168.

* cited by examiner

METHOD FOR DETERMINING PARAMETERS OF AN ELECTROCHEMICAL ENERGY STORE IN A COMPUTER-AIDED MANNER

CROSS-REFERENCE TO RELATED APPLICATIONS

This application claims priority to PCT Application No. PCT/EP2016/069226, having a filing date of Aug. 12, 2016, based on German Application No. 10 2015 222 683.2, having a filing date of Nov. 17, 2015, the entire contents both of which are hereby incorporated by reference.

FIELD OF TECHNOLOGY

The following relates to a method for determining parameters of an electrochemical energy store in a computer-aided manner.

BACKGROUND

In order to be able to operate electrochemical energy stores economically, it is necessary for the behavior of the energy store to be predicted for a specific time horizon into the future. This requires specific parameters of the electrochemical energy store which are often difficult to determine.

As a rule, important parameters of an electrochemical energy store are known to the manufacturer of the energy store. However, this often involves internal technical knowledge of the manufacturer which the manufacturer would not wish to make public. Furthermore, even if specific parameters are made public by the manufacturer, this has the disadvantage that these parameters always relate to a specific energy store type and not to a specific example of an energy store. It is therefore possible for a situation to occur in which a specific electrochemical energy store behaves differently than is stated in the type specification. This can result, for example, from fluctuations in the manufacturer's conditions.

SUMMARY

An aspect relates to easily determining informative parameters of an electrochemical energy store.

The method according to embodiments of the invention determines parameters of an electrochemical energy store, wherein the term electrochemical energy store is to be understood in a broad fashion and can comprise, in particular, any types of batteries. The electrochemical energy store is preferably an energy store for buffering energy in electrical power supply systems, for example for buffering energy which is generated by regenerative energy generating systems such as photovoltaic systems or wind turbines.

In the method according to embodiments of the invention, a multiplicity of chronologically successive measurement data records are processed. These measurement data records can already have been determined before the execution of the method, but the measurement of the data can itself be a component of the method. A respective measurement data record of the multiplicity of measurement data records comprises the following measured values for an assigned measurement time:
a measured voltage value of a terminal voltage of the energy store, a measured current value of a current flow in the form of a charging current or discharging current of the energy store, and a state of charge measured value of the state of charge of the energy store.

In specific embodiments, the temperature of the electrochemical energy store at the assigned measurement time is also included in a respective measurement data record.

In the method according to embodiments of the invention, a predefined model of the energy store is processed, wherein this model describes the terminal voltage as a function of the state of charge and the current flow of the energy store. This predefined model comprises the following indeterminate parameters (i.e. parameters which are to be determined at least partially by the method according to embodiments of the invention and therefore initially constitute variables in the model):
a nominal open-circuit voltage which represents the open-circuit voltage of the energy store without a current flow at a predefined state of charge value (e.g. 50% of the full charge), a voltage factor which is part of a term of the terminal voltage which is dependent on the state of charge, and an internal resistance of the energy store, which is part of a term of the terminal voltage which is dependent on the current flow.

Within the scope of the method according to embodiments of the invention, equation parameters of at least one linear equation system are stipulated by means of a plurality of first measurement data records and/or second measurement data records and/or third measurement data records. Each of the first to third measurement data records (if present) is selected from the multiplicity of measurement data records. Each of the first to third measurement data records (if present) is assigned here a separate linear equation system whose equation parameters are determined. According to embodiments of the invention, in the first measurement data records the temperatures of the energy store are essentially equal in magnitude. In contrast, the second measurement data records are pairs of measurement data records at successive measurement times with a current step in the current flows (i.e. the corresponding measured current values) at the successive measurement times. The third measurement data records are distinguished by the fact that the current flows (i.e. the corresponding measured current values) in these measurement data records are essentially 0.

After the corresponding equation parameters have been stipulated, the nominal open-circuit voltage which has already been defined above and the voltage factor which has already been defined above are determined by solving the at least one linear equation system.

The method according to embodiments of the invention has the advantage that by means of easily detected measured values of an electrochemical energy store it is possible to determine informative parameters thereof in the form of a nominal open-circuit voltage and a voltage factor. The determined parameters are specific here to the energy store for which the corresponding measurement data records were acquired. By means of the nominal open-circuit voltage and the voltage factor it is possible to draw conclusions, in a manner known per se, about the operating state of the energy store and the service life thereof.

In one particularly preferred variant of the method according to embodiments of the invention, the predefined model of the electrochemical energy store is based on the following equation:

$$U(t) = U0_{nom} + dU0^{*}(SOC(t)-p) + R(T, SOC(t))^{*}I(t),$$

where t is the time;
where U(t) is the terminal voltage:
where $U0_{nom}$ is the nominal open-circuit voltage;

where dU0 is the voltage factor;
where p is the predefined state of charge value;
where SOC(t) is the state of charge,
where R(T,SOC(t)) is the internal resistance;
where T is the temperature; and
where I(t) is the current flow.

The above model is known per se from the prior art and is very well suited to describing the behavior of an electrochemical energy store.

In one particularly preferred embodiment, in the predefined model of the energy store the internal resistance is described by a product of a first function and a second function, wherein the first function depends on the temperature of the energy store and the second function depends on the state of charge of the energy store. The first function is unknown here whereas the second function is predefined. In one preferred variant, what is referred to as a bathtub profile is used as a second function, as will be explained in more detail below.

In a further variant, the equation parameters of the linear equation system, or of one of the linear equation systems, are stipulated by means of the first measurement data records (i.e. at the same temperatures).

The linear equation system with the stipulated equation parameters is as follows here:

$$A * x = B$$

where $$A = \begin{pmatrix} 1 & SOC(i_1) - p & R_2(SOC(i_1)) * I(i_1) \\ 1 & SOC(i_2) - p & R_2(SOC(i_2)) * I(i_2) \\ 1 & SOC(i_3) - p & R_2(SOC(i_3)) * I(i_3) \end{pmatrix},$$

$$B = \begin{pmatrix} U(i_1) \\ U(i_2) \\ U(i_3) \end{pmatrix},$$

$$x = \begin{pmatrix} U0_{nom} \\ dU0 \\ R_1(T) \end{pmatrix}$$

where $i_1$, $i_2$ and $i_3$ are respective measurement times for three first measurement data records;
where T is the temperature in the first measurement data records;
where $R_1$ is the first function; and
where $R_2$ is the second function.

This equation system can be solved with methods known per se by forming the inverses of the matrix A.

In a further variant of the method according to embodiments of the invention in which the equation parameters of the linear equation system, or of one of the linear equation systems, are in turn stipulated by means of the first measurement data records, these first measurement data records are determined in an automated fashion in an automatic mode of the method. In this context, the first measurement data records are selected from the multiplicity of measurement data records on the basis of a tolerance value, wherein temperatures of two measurement data records are categorized as the same if they differ from one another by less than the predetermined tolerance value. The automated selection is preferably configured in such a way that the measurement times of the first measurement data records have the largest possible time intervals from one another. This ensures that a numerically stable solution is obtained for the above linear equation system.

In a further variant of the method according to embodiments of the invention, the equation parameters of the linear equation system, or of one of the linear equation systems, are stipulated by means of the second measurement data records (i.e. in the case of current steps), wherein the linear equation system with the stipulated equation parameters is as follows:

$$A * x = B$$

where $$A = \begin{pmatrix} 1 & SOC(i_1) - p \\ 1 & SOC(i_2) - p \end{pmatrix},$$

$$B = \begin{pmatrix} U(i_1) - R(i_1) * I(i_1) \\ U(i_2) - R(i_2) * I(i_2) \end{pmatrix},$$

$$x = \begin{pmatrix} U0_{nom} \\ dU0 \end{pmatrix}$$

where $i_1$ is a measurement time from a first pair of measurement data records at successive measurement times, and $i_2$ is a measurement time from another second pair of measurement data records at successive measurement times;
where $R(i_1)$ is the internal resistance at the measurement time $i_1$ and is determined as a quotient of the difference of the terminal voltages (i.e. of the corresponding measured voltage values) at the measurement times of the first pair and the difference of the current flows (i.e. of the corresponding measured current values) at the measurement times of the first pair;
where $R(i_2)$ is the internal resistance at the measurement time $i_2$ and is determined as a quotient of the difference of the terminal voltages (i.e. of the corresponding measured voltage values) at the measurement times of the second pair and the difference of the current flows (i.e. of the corresponding measured current values) at the measurement times of the second pair.

This equation system can be solved with methods known per se by forming the inverses of the matrix A.

In a further variant of the method according to embodiments of the invention, the equation parameters of the linear equation system, or of one of the linear equation systems, are stipulated by means of the second measurement data records, wherein the second measurement data records are selected, in an automated manner in an automatic mode of the method, from the multiplicity of measurement data records on the basis of a current threshold. A current step is present here when the current flow (i.e. the corresponding measured current value) from one measurement data record to the chronologically next measurement data record exceeds the predetermined current threshold. The automated selection is preferably configured in such a way that pairs of measurement data records are selected with the greatest possible difference with respect to one another in the state of charge measured value of the pairs. This in turn ensures a numerically stable solution for the above equation system.

In a further variant of the method according to embodiments of the invention, the equation parameters of the linear equation system, or of one of the linear equation systems, are stipulated by means of the third measurement data records. In this context, the linear equation system with the stipulated equation parameters is as follows:

$$A * x = B$$

-continued where $$A = \begin{pmatrix} 1 & SOC(i_1) - p \\ 1 & SOC(i_2) - p \\ \ldots & \ldots \\ 1 & SOC(i_n) - p \end{pmatrix},$$

$$B = \begin{pmatrix} U(i_1) \\ U(i_2) \\ \ldots \\ U(i_n) \end{pmatrix},$$

$$x = \begin{pmatrix} U0_{nom} \\ dU0 \end{pmatrix}$$

where $i_1, i_2, \ldots, i_n$ are respective measurement times of the third measurement data.

This equation system can be solved with methods known per se by forming the pseudo-inverses of the matrix A.

In one preferred embodiment of the invention in which the equation parameters of the linear equation system, or of one of the linear equation systems, are stipulated by means of the third measurement data records, the third measurement data records are obtained, in an automated manner in an automatic mode of the method, from the multiplicity of measurement data records on the basis of a current threshold, wherein a current flow of 0 is present when the current flow (i.e. the corresponding measured current value) is less than the predetermined current threshold. The automated selection is preferably configured in such a way that third measurement data records with the largest possible differences in the state of charge value are selected, which in turn ensures a numerically stable solution of the equation system.

In a further variant of the method according to embodiments of the invention, in addition to the nominal open-circuit voltage and the voltage factor, corresponding function parameters of the first function defined above are also determined, i.e. the dependence of the internal resistance on the temperature is determined. The function parameters are determined here using the nominal open-circuit voltage and the voltage factor, which are determined within the scope of the method according to embodiments of the invention. In this context, the first function is preferably as follows:

$$R_1(T) = (a_R * e^{-b_R + T} + c_R),$$

where T is the temperature of the energy store; and
where $a_R$, $b_R$ and $c_R$ represent the function parameters.

In one preferred variant of the method according to embodiments of the invention, three measurement data records at different temperatures are included in the determination of the function parameters as described above. The measurement data records with the largest possible distance between their temperatures are preferably selected as the three measurement data records from the multiplicity of measurement data records. This ensures a numerically stable determination of the function parameters.

As an alternative or in addition to the abovementioned automatic mode, within the scope of embodiments of the invention it is also possible, if appropriate, to use a manual mode for selecting the first and/or second and/or third measurement data records. According to this mode, a user interface is made available and the corresponding measurement data records are selected by specifying a user at the user interface.

In addition to the method described above, embodiments of the invention relates to a device for determining parameters of an electrochemical energy store in a computer-aided manner, wherein the device comprises a computer unit which is designed to carry out the method according to embodiments of the invention or one or more preferred variants of the method according to embodiments of the invention.

Moreover, the embodiment comprises a computer program product (non-transitory computer readable storage medium having instructions, which when executed by a processor, perform actions) having a program code, stored on a machine-readable carrier, for carrying out the method according to embodiments of the invention or one or more preferred variants of the method according to embodiments of the invention when the program code is run on a computer.

The embodiment also relates to a computer program having a program code for carrying out the method according to embodiments of the invention or one or more preferred variants of the method according to embodiments of the invention when the program code is run on a computer.

Exemplary embodiments of the invention are described below in detail with reference to the appended figures.

BRIEF DESCRIPTION

Some of the embodiments will be described in detail, with references to the following Figures, wherein like designations denote like members, wherein.

DETAILED DESCRIPTION

Figure 1:
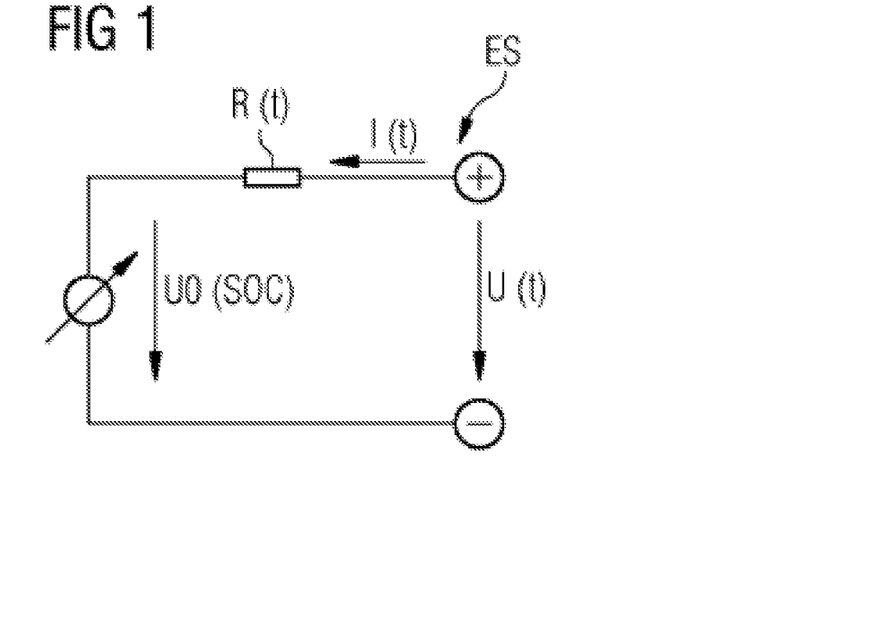
FIG. 1 shows a schematic illustration of an electrochemical energy store whose parameters are determined with an embodiment of the method.

An embodiment of the invention will be described below with reference to an electrochemical energy store in the form of a battery. Such an energy store is shown in FIG. 1 and denoted by ES. The terminal voltage U(t) is present at the illustrated terminals in the form of a positive pole and a negative pole of the battery, wherein the variable t in the text which follows denotes the time. In the embodiment described here, the battery is currently being charged, with the result that a charging current I(t) flows into the battery. The battery has a chronologically variable internal resistance R(t) which depends on the current state of charge SOC and the temperature of the battery. In addition, the battery has an open-circuit voltage U0(SOC) which is the voltage of the battery without a charging current and depends on the state of charge SOC. In the embodiments described below, a nominal open-circuit voltage $U0_{nom}$ at a predefined state of charge SOC, which is, for example, 50% of the fully charged state, is considered in this case.

As mentioned above, in the variants described below, a charging operation of the battery with a charging current I(t) is considered. The charging current is defined as a positive value here. Nevertheless, the following embodiments can also be used in an analogous fashion for operation of the battery during discharging, in which case the current I(t) represents a discharging current with a negative sign.

The object of the variants described here for the method according to embodiments of the invention is to determine informative parameters of the battery on the basis of a plurality of measurement data records which have been determined or measured at the battery at various measurement times. If appropriate, the process of measurement can also be part of the method described here.

The following measured values of the battery at respective measurement times are determined:
charging current I(t) of the battery;
terminal voltage U(t) of the battery;
temperature T of the battery; and
state of charge SOC of the battery.

The nominal open-circuit voltage $U0_{nom}$ and a voltage factor dU0 which have already been mentioned above are then determined by means of a plurality of such measurement data records. This voltage factor describes a linear relationship of the changing of the terminal voltage as a function of the state of charge of the battery, as is described in more detail below.

All the variants of embodiments of the invention which are explained below are based on the following model for describing the terminal voltage U(t):

$$U(t)=U0_{nom}+dU0*(SOC(t)-p)+R(T,SOC(t))*I(t). \quad (1)$$

Here, $U0_{nom}$ denotes the nominal open-circuit voltage at a predefined state of charge value p, which is 50% of the full charge in one preferred variant. The variable dU0 represents the voltage factor already mentioned above, and R represents the internal resistance of the battery. In addition, I(t) denotes the positive charging current, and SOC(t) represents the state of charge.

In the text which follows, three different embodiments according to which the parameters $U0_{nom}$ and dU0 can be determined on the basis of embodiments of the invention are described. The individual variants can be used individually here as a function of the available measured values, or, if appropriate, also in combination in order to improve the measuring accuracy.

Figure 2:
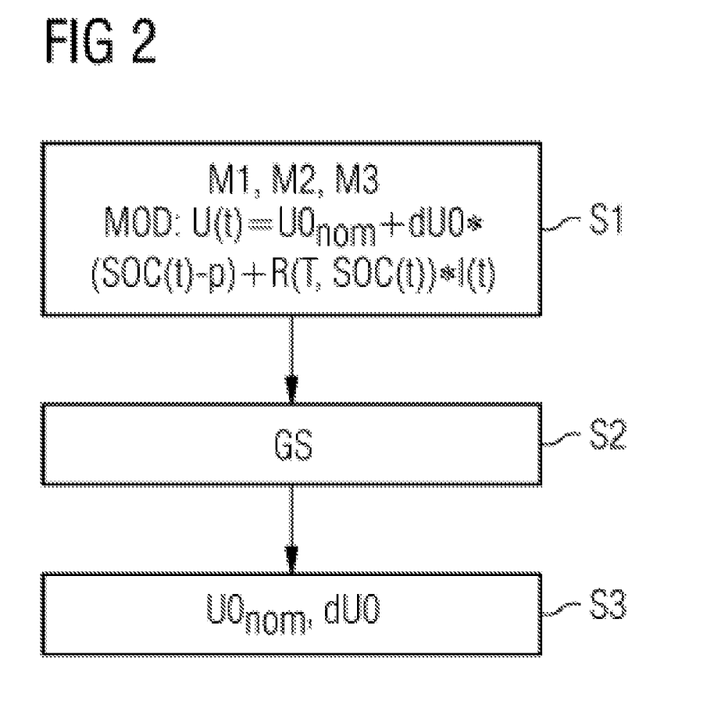
FIG. 2 shows a flowchart which clarifies the essential steps of a variant of the method.

FIG. 2 shows a diagram which clarifies the essential method steps of the embodiments described below. The starting point of the method according to step S1 is a multiplicity of chronologically successive measurement data items, wherein depending on the variant used first measurement data M1 at the same temperature values, second measurement data M2 at current steps which occur and/or third measurement data M3 at a charging current of essentially 0 are considered. All these measurement data are selected from the original measurement data. Each of the methods described below uses a predefined model MOD of the terminal voltage which is described by the abovementioned equation (1) which is represented once more in FIG. 2 for illustrative purposes. On the basis of this model and taking into account the corresponding measurement data records, equation parameters of a linear equation system GS are then defined in a step S2. Subsequently, this equation system GS is solved in step S3 with known methods, as a result of which the corresponding parameters $U0_{nom}$ and dU0 of the battery are obtained.

According to a first variant of embodiments of the invention, which is also referred to as a temperature method, the parameters $U0_{nom}$ and dU0 are obtained on the basis of first measurement data records M1. All the measurement values of these first measurement data records are determined essentially at the same temperature of the battery. For the temperature method, the above equation (1) for describing the terminal voltage U(t) is described as follows:

$$U(t)=U0_{nom}+dU0*(SOC(t)-p)+R_1(T)*R_2(SOC)*I(t). \quad (2)$$

Figure 3:
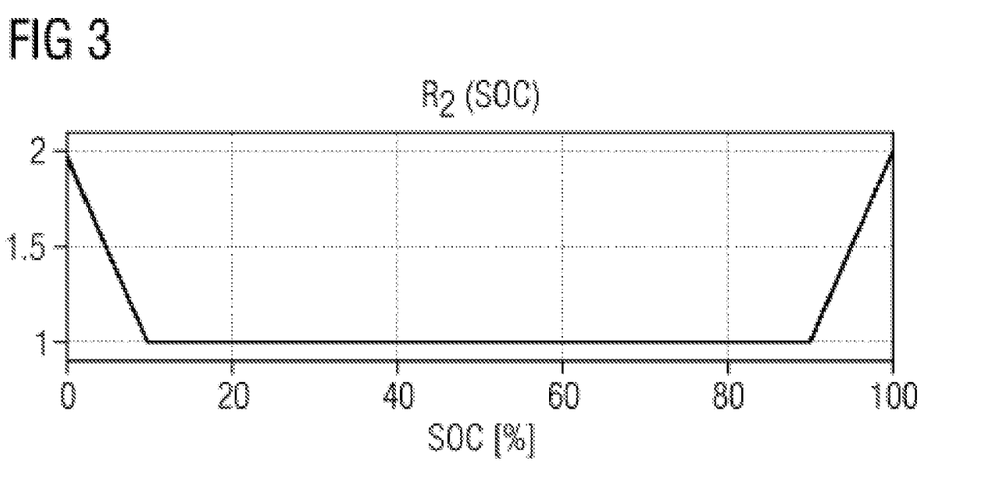
FIG. 3 shows a diagram which represents an example of a second function which depends on the state of charge of the energy store and represents a term of the internal resistance of the energy store.

In this context, the internal resistance R(T,SOC(t)) is described in a manner known per se as a product of a purely temperature-dependent first function $R_1(T)$ and a second function $R_2(SOC)$ which is purely dependent on the state of charge. The second function is predefined and has been determined empirically beforehand. An example of a profile of the second function is illustrated in FIG. 3. The function proceeds here in the manner of what is referred to as a bathtub profile. According to this profile, at small SOC values up to approximately 10% the function initially drops linearly and then proceeds to an SOC value of approximately 90% constant. Subsequently, the function rises again linearly. In the above equation (2), U(i), SOC(i) and I(i) are known for each time i of the measurement data records. Since the second function $R_2(i)$ is also assumed to be known, the three unknown variables $U0_{nom}$, dU0 and $R_1(T)$ remain.

As already mentioned, first measurement data records with essentially the same temperature T of the energy store will now be considered. In this context, three such measurement data records are determined at corresponding times $(i_1,i_2,i_3)$, with the corresponding temperature T. This can take place in an automated fashion, as will also be explained in more detail below. If appropriate, a user interface via which a user specifies corresponding measurement data records of the same temperatures can also be provided. By considering these three measurement data records it is then possible to construct a linear equation system of rank 3 A*x=B, where the following applies:

$$A = \begin{pmatrix} 1 & SOC(i_1)-p & R_2(SOC(i_1))*I(i_1) \\ 1 & SOC(i_2)-p & R_2(SOC(i_2))*I(i_2) \\ 1 & SOC(i_3)-p & R_2(SOC(i_3))*I(i_3) \end{pmatrix}, \quad (3)$$

$$B = \begin{pmatrix} U(i_1) \\ U(i_2) \\ U(i_3) \end{pmatrix},$$

$$x = \begin{pmatrix} U0_{nom} \\ dU0 \\ R_1(T) \end{pmatrix}.$$

This equation system is subsequently solved in a manner known per se by determining the inverses of A, i.e. the following is determined:

$$x=A^{-1}*B.$$

In this way the battery parameters U0nom and dU0 are obtained.

The text which follows describes how according to one variant of embodiments of the invention such (first) three measurement data records with the same temperature can be determined in an automated manner from the measurement data records.

In a step 1, a tolerance value of a temperature difference $T_{eps}$ is stipulated.

In a step 2 a target temperature $T_t$ of the corresponding first measurement data records is to set the minimum temperature $T_{min}$ of all the temperatures of the measurement data records which are present.

In a step 3, n≥3 measurement times with the following temperature condition are determined: $T(i_1, i_2, \ldots, i_n) \in [T_t-T_{eps}, T_t+T_{eps}]$. If three such measurement times cannot be found, the target temperature $T_t$ is increased by d_Temp ($T_t=T_t+$d_Temp) and step 3 is repeated, and precisely at a maximum until $T_t=T_{max}$ is reached. If n≥3 times are found, the process proceeds to step 4.

In step 4 it is checked whether some of the n measurement times are adjacent to one another. If this is the case, an individual measurement time of the respective set of adjacent measurement times is retained and the remaining measurement times of the set are deleted. This is necessary since adjacent measurement times can lead to a situation in which the upper matrix A becomes numerically unstable since it no longer has the rank 3. In such a case, the variable x can no longer be determined. After the measurement times have passed, the process proceeds to the next step 5.

In step 5 it is initially checked whether there are still at least three measurement times after the deletion of the adjacent measurement times. If this is the case, a suitable set of measurement times $(i_1, i_2, \ldots, i_n)$ has been found, and the process proceeds to step 6. If this is not the case, the target temperature $T_t$ is increased with the increment d_Temp ($T_t=T_t+$d_Temp), and the process returns to step 3.

In step 6, from the set $(i_1, i_2, \ldots, i_n)$ of measurement times with the same temperature those indices which cover the largest time difference are selected, i.e. $i_1, i_n$ are selected therefrom as indices, and the additional index which is adjacent to $(i_1+i_n)/2$ is selected therefrom.

In step 7 it is checked whether $T_t<T_{max}$ applies. If this is the case, the process returns to step 3, in order to find additional suitable sets of measurement times. Otherwise, the method is ended, provided at least one set of measurement times has been found. If it was not possible to find such a set, the tolerance value $T_{eps}$ is increased and the process returns to step 2.

After the iteration just carried out it is possible that there are more sets of suitable measurement times and therefore first measurement data records. In this case, that set which gives rise to the matrix A which is the numerically most stable one is identified. For this purpose, the variance of the second and third columns of the matrix A is calculated for each set of three measurement times at the same temperature. That set of measurement times with the maximum sum of variances is then determined from the second and third columns. The matrices A and B and the vector x and therefore the parameters $U0_{nom}$ and dU0 are then determined for this optimum set of corresponding measurement times.

In a second variant of the method described here, which is referred to as a current step method, the determination of $U0_{nom}$ and dU0 takes place at occurring current steps between chronologically adjacent measurement data records.

The following model for the terminal voltage is in turn considered:

$$U(t)=U0_{nom}+dU0*(SOC(t)-p)+R(t)*I(t). \quad (4)$$

Here, the internal resistance R(t) is described in turn by a first and second function as follows:

$$R(t)=R_2(SOC(t))*R_1(T(t)) \quad (5)$$

In the above equation (4), the variables U(i), SOC(i) and I(i) are known for each measurement time i. There are therefore only the three unknown variables $U0_{nom}$, dU0 and R(i).

Use is now made of the fact that at measuring times at which a sudden current step (i.e. a large change in current) of the current flow I(t) occurs, the temperature T and the state of charge SOC do not change significantly. Accordingly, the internal resistance R(t) before and after the current step can be assumed to be constant and can be determined on the basis of the following equation:

$$R(i) = \frac{U(i+1)-U(i)}{I(i+1)-I(i)}.$$

Here, i denotes the measurement time before the current step and i+1 denotes the measurement time after the current step. Accordingly, the internal resistance R(i) at the corresponding current step is also known, and only $U0_{nom}$ and dU0 remain as unknown variables.

In the current step method described here, two current steps are now identified in the measurement data records and the linear equation system A*x=B is defined on the basis thereof, wherein the following applies:

$$A = \begin{pmatrix} 1 & SOC(i_1)-p \\ 1 & SOC(i_2)-p \end{pmatrix}, \quad (6)$$

$$B = \begin{pmatrix} U(i_1)-R(i_1)*I(i_1) \\ U(i_2)-R(i_2)*I(i_2) \end{pmatrix},$$

$$x = \begin{pmatrix} U0_{nom} \\ dU0 \end{pmatrix}.$$

Here, $i_1$ denotes a measurement time of adjacent measurement times of a current step, and $i_2$ denotes a measurement time of adjacent measurement times of the other current step.

The above equation system (6) is then determined by determining the inverses of A, i.e., the following is determined:

$$x=A^{-1}*B.$$

In this way, the battery parameters dU0 and $U0_{nom}$ are in turn obtained.

The text which follows describes how corresponding current steps can be selected in an automated fashion from the measurement data records.

In a step 1, a counter c=0 is initialized.

In a step 2, the maximum distribution of the charging currents is determined as a function of the measurement data records present, i.e. the following is determined $\Delta max=|I_{max}-I_{min}|$.

In a step 3, an initial threshold factor f (e.g. f=0.3) is determined. A current step is then identified here for two successive measurement times i and i+1 if the following condition applies:

$$|I(i+1)-I(I)|>f*\Delta max. \quad (7)$$

In a step 4, it is checked starting with the measurement time i=1 whether the above condition according to equation (7) is satisfied. If this is the case, a suitable current step has been determined. Subsequently, the counter c is incremented and the corresponding time i is stored. Finally, the process continues with i=i+1, and the step 4 is repeated until all the measurement data records have been run through.

In a step 5 it is checked whether at least two current steps have been determined. If this is the case, the process proceeds to step 6. If this is not the case, the threshold factor f (e.g. f=0.9*f) is reduced, and the process returns to step 4 until c≥2 current steps have been found or until the threshold factor f has dropped below a minimum value (e.g. $f_{min}$=0.05). In the case of f<$f_{min}$, not enough current steps have been found, and the algorithm is ended.

In step 6, from the respective current steps (i.e. the pairs of successive measurement times of the respective current steps) those current steps are selected for which the difference between the state of charge value of the battery is largest. This is done by selecting from the determined current steps those two current steps for which the state of charge is at a maximum and at a minimum. This takes into account the fact that two measurement times with essentially the same state of charge would lead to a situation in which the matrix A becomes numerically unstable. In this case, A cannot be used to calculate the above vector x and therefore cannot be used to calculate $U0_{nom}$ and dU0.

In a step 7, $U0_{nom}$ and dU0 are then determined by means of the above equation system (6).

Figure 4:
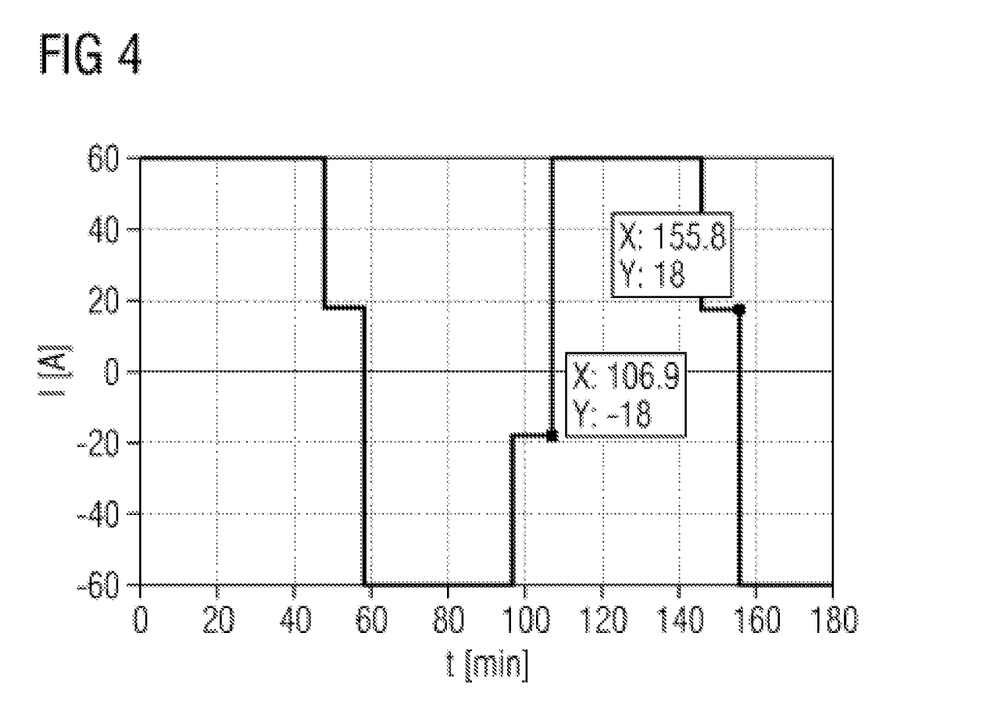
FIG. 4 shows a first diagram which clarifies the selection of measurement data records with current steps according to one variant of the method.
Figure 5:
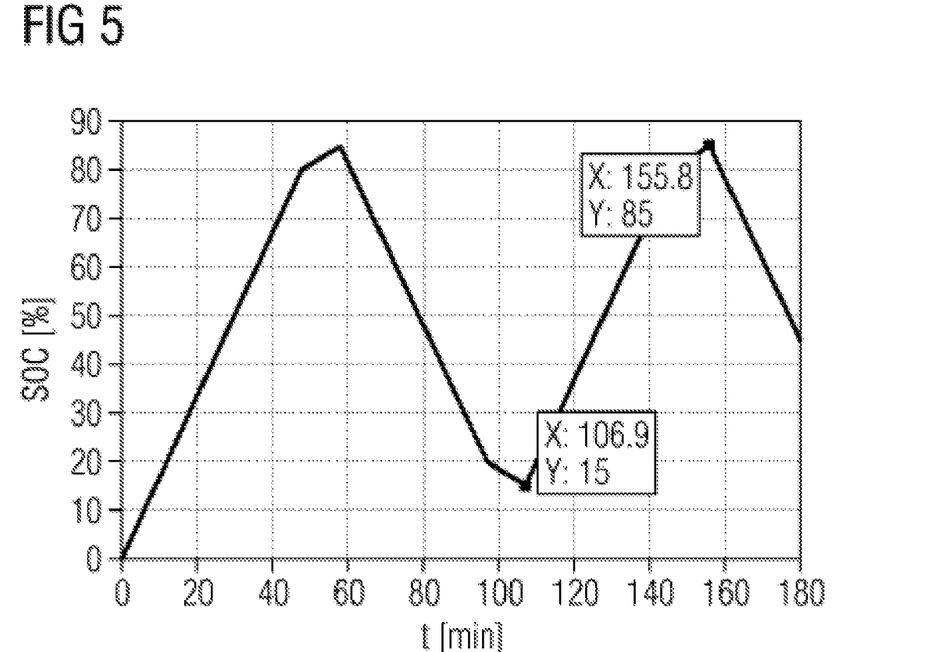
FIG. 5 shows a second diagram which clarifies the selection of measurement data records with current steps according to one variant of the method.

FIG. 4 and FIG. 5 show two diagrams which represent a result of the algorithm just described for the automated selection of current steps. FIG. 4 represents here the current values I plotted against the time t (i.e. the successive measurement times), whereas FIG. 5 represents the corresponding SOC values at the measurement times from FIG. 4. In this context, current jumps which have been identified with the algorithm are indicated by means of two right angles in the respective diagrams. As is apparent from the comparison of FIG. 4 and FIG. 5, those current jumps for which the SOC difference is at a maximum have been selected as the two current jumps.

As an alternative to the mathematical determination of current jumps as just described, it is, if appropriate, also possible again to provide a user interface via which a user can stipulate current jumps in the measurement data records interactively. For example for this purpose the current time profile of the current can be represented, with the result that the user can, for example, use a mouse to select those points which are to be treated as current jumps.

A third variant of embodiments of the invention for determining $U0_{nom}$ and dU0 is described below. In this variant, measurement data records in which the current I(t) is essentially 0 are considered. Accordingly, the above equation (1) for the terminal voltage U(t) can be simplified as follows:

$$U(t)=U0_{nom}+dU0*(SOC(t)-p). \quad (8)$$

In this variant, n≥2 measurement times with a current of essentially 0 are determined (if present), and the following equation system is subsequently defined from n linear equations:

$$A*x = B, \quad (9)$$

where:

$$A = \begin{pmatrix} 1 & SOC(i_1)-p \\ 1 & SOC(i_2)-p \\ ... & ... \\ 1 & SOC(i_n)-p \end{pmatrix},$$

$$B = \begin{pmatrix} U(i_1) \\ U(i_2) \\ ... \\ U(i_n) \end{pmatrix},$$

$$x = \begin{pmatrix} U0_{nom} \\ dU0 \end{pmatrix}.$$

This equation system is solved, with the pseudoinverse of A being determined for this purpose, i.e. the vector x is determined as follows:

$$x=A^{+}*B.$$

In this variant, at least two measurement times are required, but it is also possible to use a larger number. The larger the number of measurement times, the more robust the algorithm.

The following text describes how the measurement times can be determined in an automated manner with corresponding current values of 0. However, these measurement times can also alternatively be specified manually via a user interface.

In a step 1, such measurement times i are determined from the measurement data records for which $|I(i)|<I_{threshold}$ applies. The variable $I_{threshold}$ can be defined suitably depending on the refinement (e.g. 1e-4). The measurement times which are found are then treated as measurement times with current values of 0. If at least two measurement times are not found in step 1, the method for determining the battery parameters cannot be carried out, and the algorithm is ended.

If a plurality of such measurement times are to be determined, in a step 2, from these measurement times that with the smallest and the highest SOC value is selected. This gives rise in turn to the best numerical stability.

In a step 3, those measurement times which have SOC values in the vicinity of the measurement times which have already been selected are subsequently removed from the set of measurement times with current values of 0. In this way, in order to determine the battery parameters, measurement times are searched for whose SOC values are at a large distance from the measurement times which have already been selected.

In a further refinement of the method according to embodiments of the invention, which refinement can be combined with any of the variants described above for determining dU0 and $U0_{nom}$, parameters for describing the above first function $R_1(t)$ are also determined. It is assumed here that this first function can be described by means of the parameters $a_R$, $b_R$ and $c_R$, where $R_1(t)$ is as follows:

$$R_1(T)=a_R*e^{-b_R*T}+c_R. \quad (10)$$

The internal resistance R is therefore represented by the following equation:

$$R(T,SOC)=R_1(T)*R_2(SOC)=(a_R*e^{-b_R*T}+c_R)*R_2(SOC), \quad (11)$$

The second function $R_2(SOC)$ is in turn known and can be represented e.g. by the above bathtub profile.

In order to determine the parameters $a_R$, $b_R$ and $c_R$, three measurement times ($i_1,i_2,i_3$) with different temperature values $T(i_1)$, $T(i_2)$, $T(i_3)$ are selected. The measurement times ($i_1,i_2,i_3$) can be selected, for example, randomly from the measurement data records. However, the measurement times are preferably selected in such a way that the temperatures $T(i_1)$, $T(i_2)$, $T(i_3)$ are at the largest possible distance from one another. In order to achieve this, the measurement times with the minimum and the maximum of all the temperatures from the measurement data records are determined as the measurement times $i_1$ and $i_3$. Approximately the average temperature value between the minimum temperature and the maximum temperature is then stipulated as a further measurement time $i_2$, i.e. the following applies $$T(i_1), = T_{min}, T(i_3) = T_{max}, T(i_2) \approx \frac{T_{min} + T_{max}}{2}.$$

By using the above equations (4) and (5), the first function can be written as follows for corresponding measurement times i:

$$R_1(T(i)) = \frac{U(T(i)) - U0_{nom} - dU0 * (SOC(T(i)) - p)}{R_2(SOC(T(i))) * I(T(i))}. \quad (12)$$

In this equation, U(i), SOC(i) and I(i) are known. In addition, the constant parameters $U0_{nom}$ and $dU0$ are known, since they have been determined with one of the methods described above. $R_2$, which is represented e.g. by the bathtub profile described above, is also known.

The variables $R_1(T(i_1))$, $R_1(T(i_2))$ and $R_1(T(i_3))$ for the three selected measurement times according to the above equation (12) are now determined. Subsequently, the following algorithm is used to find the parameters $a_R$, $b_R$ and $c_R$ (the following abbreviations are used here: $T(i_1)=T_1$, $T(i_2)=T_2$, $T(i_3)=T_3$).

The auxiliary variable $$R_x = \frac{R_1(T_1) - R_1(T_2)}{R_1(T_1) - R_1(T_3)}$$

is calculated.

Subsequently, the following equation is solved with a method for finding zero crossovers (e.g. a Newtonian method):

$$R_x - \frac{1 - e^{b_R*(T_1-T_2)}}{1 - e^{b_R*(T_1-T_3)}} = 0. \quad (13)$$

In this way, the parameter $b_R$ is obtained.

The parameters $a_R$ and $c_R$ can then be determined as follows:

$$a_R = \frac{R_1(T_1) - R_1(T_2)}{e^{-b_R*T_1} - e^{-b_R*T_2}}, \quad (14)$$

$$c_R = R_1(T_1) - a_R * e^{-b_R*T_1}.$$

As is apparent, the above relationship $R_1(T)=(a_R*e^{-b_R*T}+c_R)$ models the temperature dependence in a non-linear fashion. Nevertheless, in this context a linear relationship is also described insofar as the parameter $b_R$ is very small. In the event of the actual temperature dependence being virtually linear, this is detected for the method described here on the basis of a very small value of $b_R$.

The embodiments of the invention which are described above have a series of advantages. In particular, important parameters of an electrochemical energy store are determined in the form of a nominal open-circuit voltage and a voltage factor without using a specific measurement protocol. Instead, merely a sufficient number of measurement data records, which have been acquired during the operation of the battery, has to be present. Moreover, the method also permits, if appropriate, the determination of the temperature dependence of the internal resistance of the battery.

Within the scope of embodiments of the invention, three different approaches can be used to determine the battery parameters. If appropriate, the results of these different approaches can be combined with one another in order to mutually validate and improve the estimation results, e.g. in the case of noisy data.

The method of embodiments of the invention does not require any particular initialization with specific parameter values. Moreover, the method can run fully automatically, wherein in this case corresponding measurement data records are also selected automatically. Nevertheless, an interactive selection of measurement data records can also alternatively or additionally be made by a user via a user interface.

The method according to embodiments of the invention is not used to determine battery parameters for a specific type of battery but instead individually for the individual battery which is currently being used. In particular, the total service life, the anticipated energy losses, the anticipated time up to replacement and the like can be predicted with the parameters by means of methods which are known per se. In this way, the method according to embodiments of the invention provides important results for model-based planning and optimization of a battery during its service life.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The invention claimed is:

1. A method for determining parameters of an electrochemical energy store in a computer-aided manner, wherein a multiplicity of chronologically successive measurement data records are processed, wherein a respective measurement data record of the chronologically successive measurement data records comprises the following measured values for an assigned measurement time: a measured voltage value of a terminal voltage of the energy store, a measured current value of a current flow in the form of a charging current or discharging current of the energy store, and a state of charge measured value of the state of charge of the energy store, wherein a predefined model of the energy store which describes the terminal voltage as a function of the state of charge and the current flow is processed, wherein the predefined model comprises the following indeterminate parameters:

a nominal open-circuit voltage which represents the open-circuit voltage of the energy store without a current flow at a predefined state of charge value, a voltage factor which is part of a term of the terminal voltage which is dependent on the state of charge, and an internal resistance of the energy store, which is part of a term of the terminal voltage which is dependent on the current flow, the method comprising:

stipulating equation parameters of at least one linear equation system which is based on the predefined model, by means of a plurality of first measurement data records in which the temperatures of the energy store are essentially the same, and/or by means of a plurality of second measurement data records which are pairs of measurement data records at successive measurement times with a current step in the current flows at the successive measurement times, and/or by means of a plurality of third measurement data records in which the current flows are essentially zero; and determining the nominal open-circuit voltage and the voltage factor by solving the at least one linear equation system.

2. The method as claimed in claim 1, wherein the predefined model of the energy store is based on the following equation:

$$U(t)=U0_{nom}+dU0*(SOC(t)-p)+R(T,SOC(t))*I(t),$$

where t is the time;
where U(t) is the terminal voltage;
where $U0_{nom}$ is the nominal open-circuit voltage;
where dU0 is the voltage factor;
where p is the predefined state of charge value;
where SOC(t) is the state of charge,
where R(T,SOC(t)) is the internal resistance;
where T is the temperature; and
where I(t) is the current flow.

3. The method as claimed in claim 1, wherein, in the predefined model, the internal resistance is described by a product of a first function and a second function, wherein the first function depends on the temperature of the energy store and the second function depends on the state of charge of the energy store, and wherein the first function is unknown and the second function is predefined.

4. The method as claimed in claim 2, wherein the equation parameters of the linear equation system, or of one of the linear equation systems, are stipulated by means of the first measurement data records, and the linear equation system with the stipulated equation parameters is as follows:

$$A*x = B$$

where $$A = \begin{pmatrix} 1 & SOC(i_1)-p & R_2(SOC(i_1))*I(i_1) \\ 1 & SOC(i_2)-p & R_2(SOC(i_2))*I(i_2) \\ 1 & SOC(i_3)-p & R_2(SOC(i_3))*I(i_3) \end{pmatrix},$$

$$B = \begin{pmatrix} U(i_1) \\ U(i_2) \\ U(i_3) \end{pmatrix},$$

$$x = \begin{pmatrix} U0_{nom} \\ dU0 \\ R_1(T) \end{pmatrix}$$

where $i_1$, $i_2$ and $i_3$ are respective measurement times for three first measurement data records;
where T is the temperature in the first measurement data records;
where $R_1$ is the first function; and
where $R_2$ is the second function.

5. The method as claimed in claim 1, wherein the equation parameters of the linear equation system, or of one of the linear equation systems, are stipulated by means of the first measurement data records, and the first measurement data records are selected, in an automated manner in an automatic mode of the method, from the multiplicity of measurement data records on the basis of a tolerance value, wherein the temperatures of two measurement data records are categorized as the same if they differ from one another by less than the predetermined tolerance value, further wherein the automated selection is configured in such a way that the measurement times of the first measurement data records have the largest possible time intervals from one another.

6. The method as claimed in claim 1, wherein the equation parameters of the linear equation system, or of one of the linear equation systems, are stipulated by means of the second measurement data records, and the linear equation system with the stipulated equation parameters is as follows:

$$A*x = B$$

where $$A = \begin{pmatrix} 1 & SOC(i_1)-p \\ 1 & SOC(i_2)-p \end{pmatrix},$$

$$B = \begin{pmatrix} U(i_1)-R(i_1)*I(i_1) \\ U(i_2)-R(i_2)*I(i_2) \end{pmatrix},$$

$$x = \begin{pmatrix} U0_{nom} \\ dU0 \end{pmatrix}$$

where $i_1$ is a measurement time from a first pair of measurement data records at successive measurement times, and $i_2$ is a measurement time from another second pair of measurement data records at successive measurement times;
where $R(i_1)$ is the internal resistance at the measurement time $i_1$ and is determined as a quotient of the difference of the terminal voltages at the measurement times of the first pair and the difference of the current flows at the measurement times of the first pair;
where $R(i_2)$ is the internal resistance at the measurement time $i_2$ and is determined as a quotient of the difference of the terminal voltages at the measurement times of the second pair and the difference of the current flows at the measurement times of the second pair.

7. The method as claimed in claim 1, wherein the equation parameters of the linear equation system, or of one of the linear equation systems, are stipulated by means of the second measurement data records, and the second measurement data records are selected, in an automated manner in an automatic mode of the method, from the multiplicity of measurement data records on the basis of a current threshold, wherein a current step is present when the current flow from one measurement data record to the chronologically next measurement data record exceeds the predetermined current threshold, further wherein the automated selection is configured in such a way that pairs of measurement data records are selected with the greatest possible difference in the state of charge measured value.

8. The method as claimed in claim 1, wherein the equation parameters of the linear equation system, or of one of the linear equation systems, are stipulated by means of the third measurement data records, and the linear equation system with the stipulated equation parameters is as follows:

$$A*x = B$$

-continued where $$A = \begin{pmatrix} 1 & SOC(i_1) - p \\ 1 & SOC(i_2) - p \\ \cdots & \cdots \\ 1 & SOC(i_n) - p \end{pmatrix},$$

$$B = \begin{pmatrix} U(i_1) \\ U(i_2) \\ \cdots \\ U(i_n) \end{pmatrix},$$

$$x = \begin{pmatrix} U0_{nom} \\ dU0 \end{pmatrix}$$

where $i_1, i_2, \ldots, i_n$ are respective measurement times of the third measurement data.

9. The method as claimed in claim 1, wherein the equation parameters of the linear equation system, or of one of the linear equation systems, are stipulated by means of the third measurement data records, and the third measurement data records are selected, in an automated manner in an automatic mode of the method, from the multiplicity of measurement data records on the basis of a current threshold, wherein a current flow of zero is present when the current flow is less than the predetermined current threshold, further wherein the automated selection is configured in such a way that third measurement data records with the largest possible differences in the state of charge measured value are selected.

10. The method as claimed in claim 1, wherein the first function is described by means of one or more function parameters which are determined using the determined nominal open-circuit voltage and the determined voltage factor, wherein the first function is preferably as follows:

$$R_1(T) = (a_R * e^{-b_R * T} + c_R),$$

where T is the temperature of the energy store; and where $a_R$, $b_R$ and $c_R$ represent the function parameters.

11. The method as claimed in claim 10, wherein three measurement data records at different temperatures are included in the determination of the one or more function parameters, wherein the measurement data records with the largest possible distance between their temperatures are selected as the three measurement data records from the multiplicity of measurement date records.

12. The method as claimed in claim 1, wherein a user interface is made available, and the first and/or second and/or third measurement data records are selected in a manual mode of the method by specifying a user at the user interface.

13. A device for determining parameters of an electrochemical energy store in a computer-aided manner, comprising a computer unit which is designed to carry out a method as claimed in claim 1.

14. A computer program product, comprising a computer readable hardware storage device having computer readable program code stored therein, said program code executable by a processor of a computer system to implement a method as claimed in claim 1.

15. A computer program having a program code for carrying out a method as claimed in claim 1 when the program code is run on a computer.

* * * * *